United States Patent
Koide et al.

(10) Patent No.: US 6,617,668 B1
(45) Date of Patent: Sep. 9, 2003

(54) METHODS AND DEVICES USING GROUP III NITRIDE COMPOUND SEMICONDUCTOR

(75) Inventors: Norikatsu Koide, Nara-ken (JP); Hisaki Kato, Aichi-ken (JP)

(73) Assignee: Toyoda Gosei Co., Ltd., Nishikasugai-gun (JP)

(*) Notice: Subject to any disclaimer, the term of this patent is extended or adjusted under 35 U.S.C. 154(b) by 0 days.

(21) Appl. No.: 09/573,701

(22) Filed: May 19, 2000

(30) Foreign Application Priority Data

May 21, 1999 (JP) .......................... H11-142309

(51) Int. Cl.$^7$ ............. H01L 29/20; H01L 31/0304
(52) U.S. Cl. ............. 257/615; 438/483; 438/932; 438/481; 117/902
(58) Field of Search ............. 257/615; 117/902; 438/483, 932

(56) References Cited

U.S. PATENT DOCUMENTS

| | | | |
|---|---|---|---|
| 5,185,290 A | | 2/1993 | Aoyagi et al. |
| 5,798,536 A | | 8/1998 | Tsutsui |
| 6,051,849 A | | 4/2000 | Davis et al. |
| 6,110,277 A | * | 8/2000 | Braun ............ 117/94 |
| 6,121,121 A | * | 9/2000 | Koide ............ 438/481 |
| 6,146,457 A | | 11/2000 | Solomon |
| 6,153,010 A | * | 11/2000 | Kiyoku et al. ........ 17/95 |
| 6,255,198 B1 | * | 7/2001 | Linthicum et al. ...... 257/103 |
| 6,274,518 B1 | | 8/2001 | Yuri et al. |
| 6,319,742 B1 | | 11/2001 | Hayashi et al. |
| 6,329,667 B1 | | 12/2001 | Ota et al. |
| 6,355,497 B1 | | 3/2002 | Romano et al. |
| 6,365,921 B1 | | 4/2002 | Watanabe et al. |

FOREIGN PATENT DOCUMENTS

| | | |
|---|---|---|
| EP | 0 551 721 A2 | 11/1992 |
| EP | 779 666 | 6/1997 |
| EP | 0 993 048 | 4/2000 |
| EP | 1 045 431 A1 | 4/2000 |
| EP | 1 059 661 A2 | 5/2000 |
| EP | 1 059 677 A2 | 6/2000 |
| JP | S49-149679 | 4/1973 |
| JP | S48-95181 | 12/1973 |
| JP | S51-137393 | 11/1976 |
| JP | S55-34646 | 8/1978 |

(List continued on next page.)

OTHER PUBLICATIONS

Wolf et al, Silicon Processing for the VLSI Era, vol. 1, Lattice Press, 1986, p. 5.*
Zheleva et al. "Pendeo–Epitaxy—A New Approach For Lateral Growth of Gallium Nitride Structures" MRS Internet J. Nitride Semicond. Res. 4S1, G3.38, 1999.
Solid–State Electronics vol. 43 No. 10(1999) p1969–1972.
Semicond. Sci. Technol. vol. 13 No. 11(1998) p1322–1327.
Zheleva, "Pendeo–Epitaxy; A New Approach for Lateral Growth of Gallium Nitride Films" Journal of Electronic Materials, vol. 28, No. 4, p15–18, Apr. 1999.

(List continued on next page.)

Primary Examiner—Matthew Smith
Assistant Examiner—V. Yeusikov
(74) Attorney, Agent, or Firm—McGinn & Gibb, PLLC

(57) ABSTRACT

A layer comprising silicon oxide ($SiO_2$) is formed on (111) plane of a silicon (Si) substrate in a striped pattern which is longer in the [1–10] axis direction perpendicular to the [110] axis direction. Then a group III nitride compound semiconductor represented by a general formula $Al_xGa_yIn_{1-x-y}N$ ($0 \leq x \leq 1$, $0 \leq y \leq 1$, $0 \leq x+y \leq 1$) is laminated thereon. The group III nitride compound semiconductor represented by a general formula $Al_xGa_yIn_{1-x-y}N$ ($0 \leq x \leq 1$, $0 \leq y \leq 1$, $0 \leq x+y \leq 1$) grows epitaxially on the substrate-exposed regions B which are not covered by the $SiO_2$ layer, and grows epitaxially on the $SiO_2$ layer in lateral direction from the regions B. Consequently, a group III nitride compound semiconductor having no dislocations can be obtained.

5 Claims, 4 Drawing Sheets

FOREIGN PATENT DOCUMENTS

| | | |
|---|---|---|
| JP | 57-115849 | 7/1982 |
| JP | S58-33882 | 2/1983 |
| JP | H1-316459 | 12/1989 |
| JP | 03-133182 | 6/1991 |
| JP | 04-010665 | 1/1992 |
| JP | 4084418 | 3/1992 |
| JP | 5041536 | 2/1993 |
| JP | H5-110206 | 4/1993 |
| JP | 05-343741 | 12/1993 |
| JP | 06-196757 | 7/1994 |
| JP | H7-249830 | 9/1995 |
| JP | 07-273367 | 10/1995 |
| JP | 08-064791 | 3/1996 |
| JP | H8-102549 | 4/1996 |
| JP | H8-222812 | 8/1996 |
| JP | H10-312971 | 11/1998 |
| JP | 10312971 | 11/1998 |
| JP | H10-321954 | 12/1998 |
| JP | H11-31864 | 2/1999 |
| JP | 11-145516 | 5/1999 |
| JP | H11-145519 | 5/1999 |
| JP | 11-191533 | 7/1999 |
| JP | 11-191657 | 7/1999 |
| JP | 11-191659 | 7/1999 |
| JP | H11-191659 | 7/1999 |
| JP | H11-219910 | 8/1999 |
| JP | 11-251632 | 9/1999 |
| JP | 11-260737 | 9/1999 |
| JP | H11-312825 | 11/1999 |
| JP | H11-329971 | 11/1999 |
| JP | H11-330546 | 11/1999 |
| JP | H11-340508 | 12/1999 |
| JP | 2000-21789 | 1/2000 |
| JP | 2000-044121 | 2/2000 |
| JP | 2000-106455 | 4/2000 |
| JP | 2000-106473 | 4/2000 |
| JP | 2000-124500 | 4/2000 |
| JP | 2000-91253 | 5/2000 |
| JP | 2001-150959 | 5/2000 |
| JP | 2000-232239 | 8/2000 |
| JP | 2000-244061 | 9/2000 |
| JP | 2000-261106 | 9/2000 |
| JP | 2000-277437 | 10/2000 |
| JP | 2000-299497 | 10/2000 |
| JP | 2000-357663 | 12/2000 |
| JP | 2000-357843 | 12/2000 |
| JP | 2001-60719 | 3/2001 |
| JP | 2001-93837 | 4/2001 |
| JP | 2001-111174 | 4/2001 |
| JP | 2001-122693 | 5/2001 |
| JP | 2001-176813 | 6/2001 |
| JP | 2001-257193 | 9/2001 |
| WO | WO97/11518 | 3/1997 |
| WO | WO 97/11518 | 3/1997 |
| WO | WO98/47170 | 10/1998 |
| WO | WO 98/47170 | 10/1998 |
| WO | WO 99/01594 | 1/1999 |
| WO | 00/55893 | 9/2000 |
| WO | WO 02/058120 A1 | 7/2002 |

OTHER PUBLICATIONS

T.S. Zheleva "Pendeo–Epitaxy versus Lateral Epitaxial Overgrowth of GaN: A Comparative Study via Finite Element Analysis" physical Status Solidi (a), vol. 176,No. 1,p. 545–551,Nov. 1999.

Shiro Uchida, "AlGaInN based Laser Diodes" Proceedings of SPI E–The International Society for optical Engineering, vol. 384,7,p 156–164, Jan. 2000.

Yang et al., "High quality GaN–InGaN heterostructures grown on (111) silicon substrates," Apply. Phys. Lett. 69 (23), Dec. 2, 1996, pp. 3566–3568.

Hiramatsu et al., "Selective Area Growth and Epitaxial Lateral Overgrowth of GaN by Metalorganic Vapor Phase Epitaxy Adn Hydride Vapor Phase Epitaxy", Materials Science and Engineering B59, 1999, pp. 104–111.

Wolf et al., "Silicon: Single Crystal Growth and Wafer Preparation", for the VLSI Era, vol. 1–Process Technology, p. 5.

Akasaki et al., "Effects of Ain Buffer Layer on Crystallographic Structure and on Electrical and Optical Properties of GaN and Ga1–xA1xN . . . Movpe", Journal of Crystal Growth 98, North–Holland, 1989, pp. 209–219.

Dimitriadis et al., "Contacts of Titanium Nitride to n–Type and p–Type Gallium Nitride Films", Solid–State Electronics 43, 1999, pp. 1969–1972.

Luther et al., "Titanium and Titanium Nitride Contacts to n–Type Gallium Nitride", Semicond. Sct. Technol. 13, 1998, pp. 1322–1327.

Nam et al., "Lateral Epitaxy of Low Defect Density GaN Layers Via Organometallic Vapor Phase Epitaxy", Appl. Phys. Lett. 71 (18), Nov. 3, 1997, pp. 2638–2640.

European Search Report Dated Jul. 18, 2000 (EP 27057).

European Search Report Dated Feb. 15, 2002 (EP 27279).

PCT Form 210 (PCT/JP00/09120).

PCT Form 210 (PCT/JP010/1178).

PCT Form 210 (PCT/JP02/01159).

PCT Form 210 (PCT/JP02/02628).

PCT Form 210 (PCT/JP/02/05446).

PCT Form 210 (PCT/JP01/01928).

PCT Form 210 (PCT/JP01/01396).

PCT Form 210 (PCT/JP00/09121).

PCT Form 210 (PCT/JP01/02695).

PCT Form 210 (PCT/JP01/01663).

PCT Form 210 (PCT/JP00/09220).

PCT Forms 338 and 409 (PCT/JP01/01928) and translation thereof.

PCT Forms 338 and 409 (PCT/JP00/09121).

PCT Forms 338 and 409 (PCT/JP00/09120).

PCT Forms 338 and 409 (PCT/JP01/02695) and translation thereof.

PCT Forms 338 and 409 (PCT/JP01/01663) and translation thereof.

PCT Forms 338 and 409 (PCT/JP01/01396) and translation thereof.

* cited by examiner

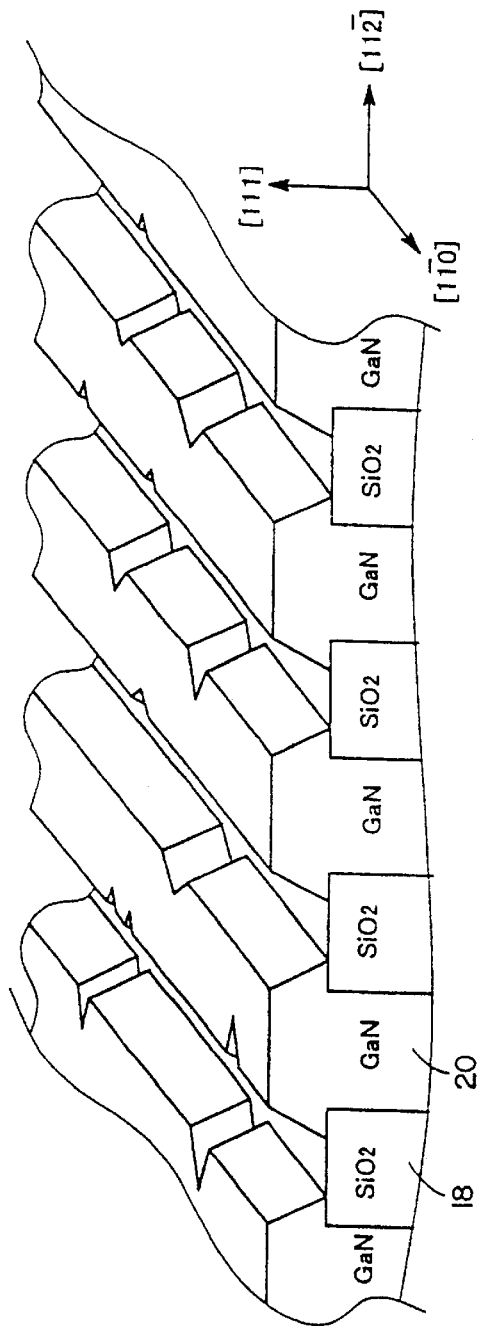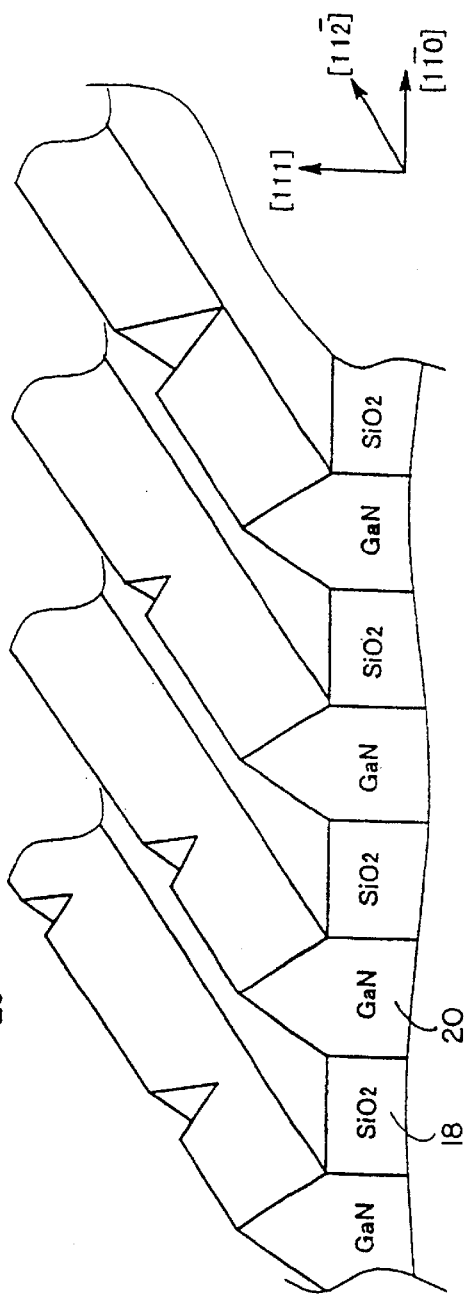
FIG. 5A
FIG. 5B

METHODS AND DEVICES USING GROUP III NITRIDE COMPOUND SEMICONDUCTOR

BACKGROUND OF THE INVENTION

1. Field of the Invention

The present invention is directed to methods and devices using a group III nitride compound semiconductor represented by a general formula $Al_xGa_yIn_{1-x-y}N$ ($0 \leq x \leq 1$, $0 \leq y \leq 1$, $0 \leq x+y \leq 1$). In particular, the present invention is directed to methods and devices using a group III nitride compound semiconductor which has a substrate comprising silicon (Si). A group III nitride compound semiconductor layer comprises binary compounds such as AlN, GaN, and InN. A group III nitride compound semiconductor layer also comprises ternary compounds such as $Al_xGa_{1-x}N$, $Al_xIn_{1-x}N$; and $Ga_xIn_{1-x}N$ ($0<x<1$). And a group III nitride compound semiconductor layer further comprises quaternary compounds such as $Al_xGa_yIn_{1-x-y}N$ ($0<x<1$, $0<y<1$, $0<x+y<1$).

2. Description of the Related Art

A group III nitride compound semiconductor is a direct-transition-type semiconductor having a wide emission spectrum range from ultraviolet to red, and is applied to light-emitting devices such as light-emitting diodes (LEDs) and laser diodes (LDs). Group III nitride compound semiconductors are, in general, formed on a sapphire substrate.

However, in the above-described conventional technique, when a layer of a group III nitride compound semiconductor is formed on a sapphire substrate, cracks and/or warpage may be generated in the semiconductor layer. These flaws form due to differences in thermal expansion coefficients between the sapphire substrate and the group III nitride compound semiconductor. As a consequence, dislocations are generated in the semiconductor layer due to misfit, resulting in degraded device characteristics. Further, because sapphire has an insulation characteristic, both positive and negative electrodes need to be formed on the same side of the sapphire substrate, resulting in limitation of miniaturizing the device and degraded manufacturing efficiency. Moreover, because the substrate and the semiconductor layer are made of different materials, the conventional laser diodes have difficulty in obtaining a good cleavage.

SUMMARY OF THE INVENTION

Accordingly, in light of the above problems, an object of the present invention is to realize an efficient method capable of forming a layer of a group III nitride compound semiconductor represented by a general formula $Al_xGa_yIn_{1-x-y}N$ ($0 \leq x \leq 1$, $0 \leq y \leq 1$, $0 \leq x+y \leq 1$) on a silicon substrate, thereby to improve device characteristics. Another object of the present invention is to obtain the optimum surface orientation of the silicon substrate and the optimum orientation for epitaxial growth when the layer of a group III nitride compound semiconductor is formed on the silicon substrate by using epitaxial growth.

In order to solve above and other problems, in a first aspect, the present invention is a device using a group III nitride compound semiconductor comprising: a silicon (Si) substrate; a layer which is formed on (111) plane of the silicon substrate such that substrate-exposed portions are formed in a scattered manner and on which a group III nitride compound semiconductor does not grow epitaxially; and a second layer which grows epitaxially on substrate-exposed portions, or the regions which are not covered by the first layer, and which grows epitaxially on the regions which are covered by the first layer in lateral direction.

The lateral direction, as used in the specification, refers to a direction parallel to a surface of the substrate (surface direction). The second layer comprising a group III nitride compound semiconductor represented by a general formula $Al_xGa_yIn_{1-x-y}N$ ($0 \leq x \leq 1$, $0 \leq y \leq 1$, $0 \leq x+y \leq 1$) does not grow epitaxially on the first layer, and the layer formed on the substrate-exposed portions grows epitaxially on the first layer in lateral direction. Dislocations due to misfit between the silicon substrate and the group III nitride compound semiconductor grow in longitudinal direction, but they hardly grow in lateral direction. Consequently, a crystallinity of the group III nitride compound semiconductor formed on the first layer can be improved. In addition, since there are no chemical junctions between the first layer and the group III nitride compound semiconductor thereabove, the second layer causes neither warpage nor distortions which would otherwise be caused by stress in the layer.

In a second aspect, the present invention is a device using group III nitride compound semiconductor comprising: a silicon (Si) substrate; a first layer which is formed on (111) plane of the silicon substrate and made of a group III nitride compound semiconductor; a second layer which is formed on the first layer such that the first layer-exposed portions are formed in a scattered manner and on which a group III nitride compound semiconductor does not grow epitaxially; and a third layer which grows epitaxially on the third layer-exposed portions, or the regions which are not covered by the second layer, and which grows epitaxially on the regions which are covered by the second layer in lateral direction.

The third layer comprising a group III nitride compound semiconductor represented by a general formula $Al_xGa_yIn_{1-x-y}N$ ($0 \leq x \leq 1$, $0 \leq y \leq 1$, $0 \leq x+y \leq 1$) is formed on an exposed portion of the first layer comprising a group III nitride compound semiconductor represented by a general formula $Al_xGa_yIn_{1-x-y}N$ ($0 \leq x \leq 1$, $0 \leq y \leq 1$, $0 \leq x+y \leq 1$), which serves as a nucleus, as in the first aspect of the present invention. Because crystal growth of the third layer is carried out not on the silicon substrate but on a substrate having the same or similar compositions to those of the third layer, crystallinity of the third layer can be improved. Here similar compositions as used in the specification refers to close lattice constants. The reference also includes the difference of composition ratios of Al, Ga and In (including 0) in the group III nitride compound semiconductor represented by a general formula $Al_xGa_yIn_{1-x-y}N$ ($0 \leq x \leq 1$, $0 \leq y \leq 1$, $0 \leq x+y \leq 1$).

In a third aspect, the present invention forms the first layer to have two-layer structure, comprising a layer made of $Al_xGa_{1-x}N$ ($0<x \leq 1$) and a layer made of a group III nitride compound semiconductor formed thereabove. By forming the first layer, a group III nitride compound including aluminum (Al) can be formed on the silicon substrate in an excellent condition, and a group III nitride compound semiconductor of improved crystallinity can be obtained on the group III nitride compound semiconductor layer.

In a fourth aspect of the present invention, the first layer is formed in a striped pattern. In a fifth aspect of the present invention, the exposed portions formed on (111) plane of the silicon substrate or the upper surface of the third layer are longer in an axis direction which is perpendicular to <110> direction of the silicon substrate. In short, the first layer is formed so that the exposed portions become longer in a direction which is perpendicular to <110> direction of the silicon substrate. The second layer is formed on (111) plane of the substrate or on the third layer. Because the crystal structure of the second layer is affected by (111) plane of the silicon substrate, it can optimize the direction of epitaxial lateral growth of the second layer. Here <110> direction represents [110], [011] and [101] axes directions.

In a sixth aspect of the present invention, the first layer is formed using silicon oxide ($SiO_2$). In this case, the second layer is formed by using a group III nitride compound semiconductor which does not include aluminum (Al), and the second layer does not grow epitaxially on the first layer but grows epitaxially in lateral direction. As a result, crystallinity of the second layer can be improved.

In a seventh aspect of the present invention, the first layer is formed using metals of high melting point or an amorphous silicon (Si). Because the first layer has conduction characteristic, electric current can flow uniformly in perpendicular direction to the surface between the second layer and the silicon substrate when the silicon substrate has conduction characteristic. As a result, electrodes can be formed on the silicon substrate and on the group III nitride compound semiconductor, and the device can be miniaturized. Metals of high melting point refer to metals whose melting point is larger than 2000° C., e.g., niobium (Nb), molybdenum (Mo), ruthenium (Ru), hafnium (Hf), tantalum (Ta), and tungsten (W).

In an eighth aspect, the present invention is a method for manufacturing the group III nitride compound semiconductor of the first to third aspects represented by a general formula $Al_xGa_yIn_{1-x-y}N$ ($0 \leq x \leq 1$, $0 \leq y \leq 1$, $0 \leq x+y \leq 1$). In a ninth aspect of the present invention, the method of the eighth aspect is repeated several times. In a tenth aspect, the present invention is a method for manufacturing the group III nitride compound semiconductor of the fourth and fifth aspects represented by a general formula $Al_xGa_yIn_{1-x-y}N$ ($0 \leq x \leq 1$, $0 \leq y \leq 1$, $0 \leq x+y \leq 1$). By using these various methods, a group III nitride compound semiconductor represented by a general formula $Al_xGa_yIn_{1-x-y}N$ ($0 \leq x \leq 1$, $0 \leq y \leq 1$, $0 \leq x+y \leq 1$) and having excellent crystallinity can be obtained.

A twelfth aspect of the present invention shows the same effect as in the sixth and seventh aspects of the present invention. A thirteenth aspect of the present invention is a wafer by removing at least silicon substrate among the silicon substrate, the third layer and the first layer. As a result, a single group III nitride compound semiconductor represented by a general formula $Al_xGa_yIn_{1-x-y}N$ ($0 \leq x \leq 1$, $0 \leq y \leq 1$, $0 \leq x+y \leq 1$) can be obtained as a substrate.

Here layers in a striped pattern are not necessarily formed on the entire surface but can be formed where they are necessary. And length of the regions formed in a striped pattern to expose the silicon substrate or the third layer can be arbitrary. The silicon or the third layer-exposed portions can be formed in a length so as to cross the entire length of the substrate, or can be formed intermittently. And when the silicon or the third layer-exposed portions are connected to the regions which are not formed in a striped pattern and the regions which are formed in a striped pattern has only a small proportion of the entire surface, that is all included in the present embodiment.

Other objects, aspects and advantages of the invention will be apparent to those skilled in the art upon reading the specification and appended claims which, when read in conjunction with the accompanying drawings, explain the principles of this invention.

BRIEF DESCRIPTION OF THE DRAWINGS

The accompanying drawings, which constitute part of this specification, serve to elucidate the principles of this invention. In such drawings:

FIGS. 5A and 5B are schematic views showing epitaxial lateral growth of the group III nitride compound semiconductor in accordance with the third embodiment of the present invention and epitaxial growth of a group III nitride compound semiconductor in accordance with a comparative example.

DETAILED DESCRIPTION OF THE PREFERRED EMBODIMENTS

Figure 1A:
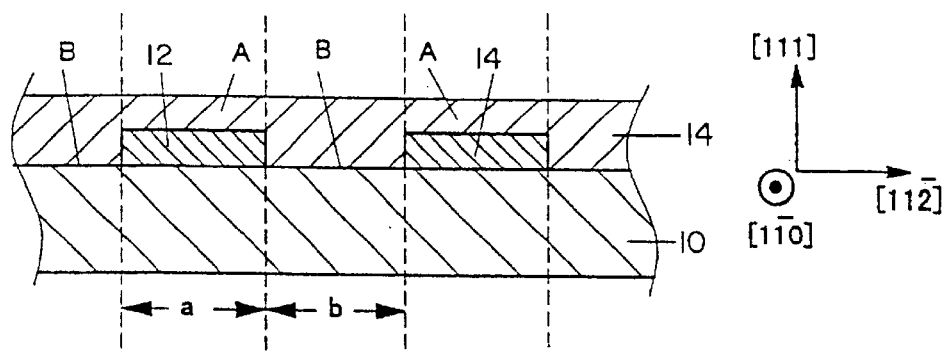
FIGS. 1A and 1B are sectional views showing a structure of a group III nitride compound semiconductor in accordance with a first embodiment of the present invention.
Figure 1B:
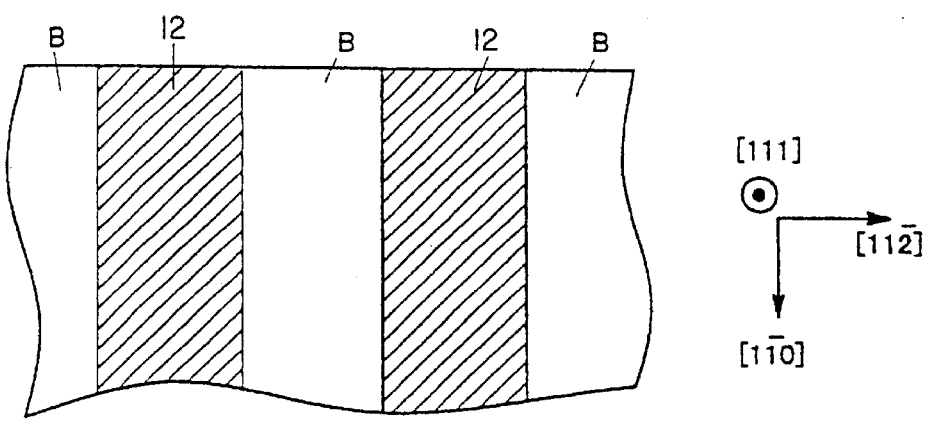

The present invention will be described hereinbelow with reference to specific embodiments. These embodiments are not exclusive or exhaustive as to scope of this invention. In FIGS. 1A–1B, 2–4, and 5A–5B, the Miller indices are represented by adding a bar over each of the numbers. In the specification, on the other hand, the Miller indices are represented by minus sign before the appropriate numbers. For example, three axes shown in FIGS. 1A–1B are described as [111], [1–10], and [11-2] in this specification.

A normal direction of the (111) plane of a silicon substrate is the [111] axis direction, and the [1–10] axis direction is perpendicular to the [110] axis direction on the (111) plane. The [11-2] axis direction is perpendicular to the [1–10] axis direction on the (111) plane. Accordingly, in FIGS. 1A–1B, 2–4, and 5A–5B, each of which illustrates structures of a semiconductor layer formed on the (111) plane by crystal growth, three axes of the silicon substrate are shown, namely the [111] axis, the [1–10] axis, and the [11-2] axis.

EXAMPLE 1

First Embodiment

FIGS. 1A–1B are schematic sectional views showing the structure of a group III nitride compound semiconductor represented by a general formula $Al_xGa_yIn_{1-x-y}N$ ($0 \leq x \leq 1$, $0 \leq y \leq 1$, $0 \leq x+y \leq 1$) according to a first embodiment of the present invention. On a silicon substrate 10, an $SiO_2$ layer (a first layer) 12 having a thickness of about 2000 Å is formed in a striped pattern (FIG. 1B). A GaN layer (a second layer) 14 having a thickness of about 10 μm is formed in regions B where the first layer 12 is removed from the silicon substrate 10 and in regions which are defined above the islands of the first layer 12.

Next, a process for manufacturing the group III nitride compound semiconductor according to an embodiment of the present invention will be described.

$SiO_2$ and the group III nitride compound semiconductor are formed through the use of a sputtering method and a metal organic vapor phase epitaxy (hereinafter referred to as "MOVPE") method, respectively. Gases used in the MOVPE method are ammonia ($NH_3$), carrier gas ($H_2$, $N_2$) and trimethyl gallium ($Ga(CH_3)_3$) (hereinafter referred to as "TMG").

First, a first layer 12 made of $SiO_2$, having a thickness about 2000 Å and a width a of about 5 μm, is formed through sputtering in a striped pattern on a silicon substrate 10, having a principal plane of (111) and cleaned with aqueous hydrofluoric acid. As shown in FIG. 1A, each of the regions B where the substrate 10 was exposed had a width b of about 5 μm. Boundary lines between the regions A (which are defined above the islands of the first layer 12) and regions B (where the first layer 12 is removed from the silicon substrate 10) are in the [1–10] axis direction, which is perpendicular to the <110> direction of the silicon substrate 10.

Then, a GaN layer having a thickness of about 10 μm is grown in accordance with the MOVPE method, in which the substrate 10 was maintained at 1100° C., and $N_2$ or $H_2$ was fed at 20 liters/min, $NH_3$ at 10 liters/min, and TMG at 100 μmol/min, thereby obtaining a second layer 14. In this case, the GaN layer grows on regions B where the substrate 10 is exposed, in perpendicular direction. In each of the regions A (which are defined above the islands of the first layer 12), GaN grows in a lateral direction, i.e., in a surface direction, from the GaN layer grown epitaxially on an exposed portion of the substrate 10, which serves as a nucleus. The second layer 14 will have dislocations along the perpendicular direction only in the regions B where the substrate 10 is exposed. When in the regions A (which are defined above the islands of the first layer 12), the GaN layer is grown epitaxially in a lateral direction, the GaN layer will have no dislocations therein. Since the area of the region A (which are defined above the islands of the first layer 12) is made larger than that of the region B (where the silicon substrate 10 is exposed), a second layer 14 made of GaN having excellent crystallinity can be formed over a wide area. In addition, since there are no chemical junctions between the first layer 12 and the GaN layer (the second layer 14) thereabove, warpage and stress-induced distortion in the second layer 14 can be significantly reduced.

Although in the above-described embodiment the regions A which are defined above the island of the first layer 12 are formed in a striped pattern has a width of about 5 μm, a preferred range for the width a is 1 μm to 10 μm. This is because when the width a of the regions A becomes larger than 10 μm, a longer time is required for the lateral growth, and when the width a of the regions A becomes smaller than 1 μm, removing $SiO_2$ film by using, e.g., hydrofluorine (HF), becomes difficult.

Additionally, although the width b of the regions B where the substrate 10 is exposed is 5 μm in this embodiment, a preferred range for the width b is 1 μm to 10 μm. This is because when the width b of the regions B becomes larger than 10 μm, the probability of generating dislocations increases, and when the width b of the regions B becomes smaller than 1 μm, obtaining a GaN film with wide area and high quality becomes difficult. Further, from the viewpoint of the crystallinity of the second layer 14, the ratio of the widths of regions A (which are defined above the first layer 12) to the width b (of the regions B where the silicon substrate 10 is exposed), i.e., a/b, is preferably within the range of 1 to 10.

EXAMPLE 2

Second Embodiment

In the first embodiment, the $SiO_2$ layer, the first layer 12, is formed on the silicon substrate 10. In this second embodiment, however, a first layer 16 made of a group III nitride compound semiconductor is formed on the silicon substrate 10. Then an $SiO_2$ layer 18 (corresponding to first layer 12 of the first embodiment) is formed on the first layer 16 in an island pattern, and a group III nitride compound semiconductor layer 20 is formed thereon.

Figure 2:
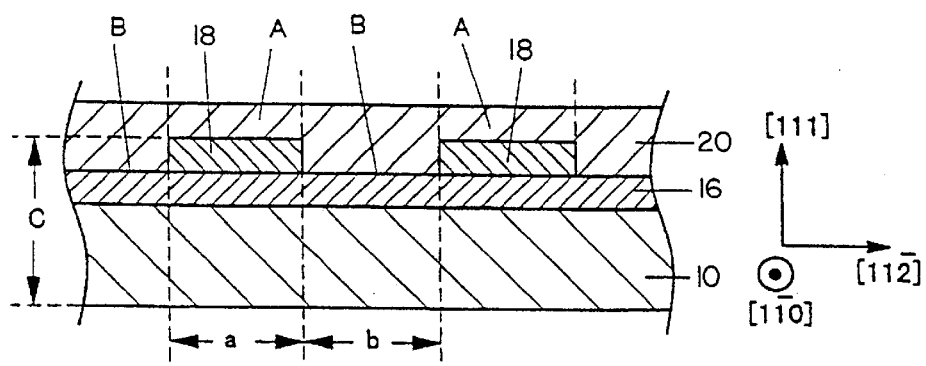
FIG. 2 is a schematic view showing a structure of a group III nitride compound semiconductor in accordance with a second embodiment of the present invention.

FIG. 2 is a schematic sectional view showing the structure of a group III nitride compound semiconductor according to a second embodiment of the present invention. On a silicon substrate 10, an $Al_{0.15}Ga_{0.85}N$ layer 16 (a first layer) having a thickness of about 1000 Å is uniformly formed. Next a second layer 18 made of $SiO_2$ and 2000 Å in thickness is formed on the first layer 16 in a striped pattern or a grid pattern, as with the first ($SiO_2$) layer 12 in the first embodiment. A GaN layer (a third layer) 20 having a thickness of about 10 μm is formed in regions B (where the second layer 18 is removed from the first layer 16) and in regions A (which are defined above the islands of the second layer 18).

Next, a process for manufacturing the group III nitride compound semiconductor according to the second embodiment of the present invention will be described.

While the substrate 10 is maintained at 1150° C., $N_2$ or $H_2$ is fed at 10 liters/min, $NH_3$ at 10 liters/min, TMG at 100 μmol/min, and trymethyl aluminum ($Al(CH_3)_3$) (hereinafter "TMA") at 10 μmol/min, resulting in formation of an $Al_{0.15}Ga_{0.85}N$ first layer 16 having a thickness of about 1000 Å.

Then, the second layer 18 made of $SiO_2$, having a thickness about 2000 Å and a width a of about 5 μm, is formed in a striped pattern on the first layer 16, and each of the regions B where the first layer 16 was exposed had a width b of about 5 μm, as in the first embodiment. Boundary lines between the regions A (which are defined above the islands of the second layer 18) and regions B (where the second layer 18 is removed from the first layer 16) are in the [1–10] axis direction, which is perpendicular to the <110> direction of the silicon substrate 10.

The third layer 20 made of GaN, having a thickness of about 10 μm, is formed on both the regions of the second layer 18 and the regions B (where the first layer 16 is exposed, as with the first and second layers 12 and 14 in the first embodiment). In this case, the GaN layer grows in perpendicular direction on regions B where the first layer 16 was exposed, using $Al_{0.15}Ga_{0.85}N$ of the exposed region B as nucleus. In each of the regions A (which are defined above the islands of the second layer 18), GaN grows in a lateral direction, from the GaN layer grown epitaxially on an exposed portion of the first layer 16, which serves as a nucleus. Accordingly, the third layer 20 made of GaN is formed on the second layer 18 and on the exposed regions of the first layer 16.

As described above, because the GaN layer grows on the $Al_{0.15}Ga_{0.85}N$ layer first, crystallinity of the GaN layer formed on the $Al_{0.15}Ga_{0.85}N$ layer improves compared with the GaN layer formed on the substrate 10. Further, by removing the silicon substrate 10 or the region C, which consists of layers from the silicon substrate 10 to the second layer 18, using polishing or etching, a group III nitride compound semiconductor substrate having no dislocations can be obtained from the third layer 20.

Although in the present embodiment the first layer 16 is formed of aluminum gallium nitride whose composition is represented as $Al_{0.15}Ga_{0.85}N$, there may be used a group III nitride compound semiconductor represented by a general formula $Al_xGa_yIn_{1-x-y}N$ ($0 \leq x \leq 1$, $0 \leq y \leq 1$, $0 \leq x+y \leq 1$) and having an arbitrary composition ratio. However, when a layer is formed epitaxially on the silicon substrate 10, $Al_xGa_{1-x}N$ ($0 < x \leq 1$)(including AlN) is preferably used. In addition, as for the third layer 20, a group III nitride compound semiconductor represented by a general formula Al$_x$Ga$_y$In$_{1-x-y}$N (0≦x≦1, 0≦y≦1, 0≦x+y≦1) and having an arbitrary composition ratio may be used. In this case, the composition ratio of the third layer 20 can or cannot be identical to that of the first layer 16.

In the present embodiment the first layer 16 has a thickness of about 1000 Å. When the first layer 16 has a thickness smaller than 100 Å, the speed of lateral overgrowth of the third layer 20 becomes smaller. So preferably, the first layer 16 has a thickness larger than 100 Å. Further preferably, the first layer 16 has a thickness larger than 500 Å.

EXAMPLE 3

A Third Embodiment

In the second embodiment, the first layer 16 has a single layer structure. However, in this third embodiment, the first layer 16 is formed to have double layer structure.

Figure 3:
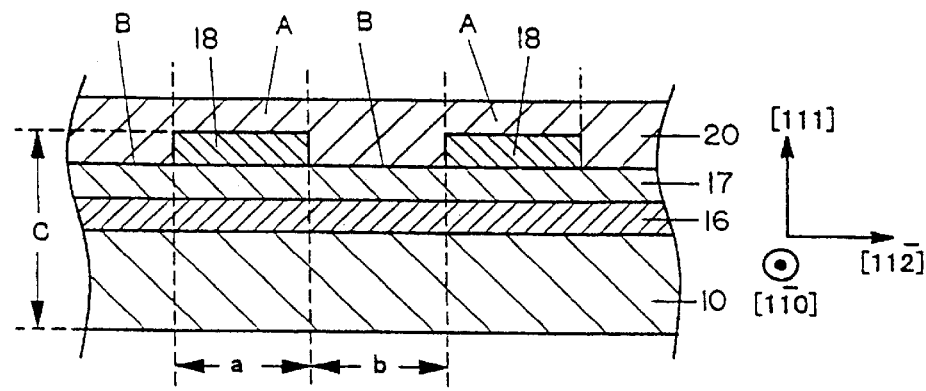
FIG. 3 is a schematic view showing a structure of a group III nitride compound semiconductor in accordance with a third embodiment of the present invention.

FIG. 3 is a schematic sectional view showing the structure of a group III nitride compound semiconductor according to a third embodiment of the present invention. On a silicon substrate 10, an Al$_{0.15}$Ga$_{0.85}$N layer 16 having a thickness of about 1000 Å is formed. A GaN layer 17 having a thickness of about 1000 Å is formed on the layer 16. Accordingly, a first layer consisting of the layers 16 and 17 is formed. On the layer 17, an SiO$_2$ layer (a second layer) 18 having a thickness of about 2000 Å is formed in a striped pattern or a grid pattern as with the SiO$_2$ layer 12 in the first embodiment. A GaN layer (a third layer) 20 having a thickness of about 10 μm is formed on the layer 17 and the second layer 18.

Next, a process for manufacturing the group III nitride compound semiconductor will be described.

The layer 16 is formed on the substrate 10 using the MOVPE method as in the second embodiment.

While the substrate 10 was maintained at 1100° C., N$_2$ or H$_2$ is fed at 20 liters/min, NH$_3$ at 20 liters/min, and TMG at 200 mol/min, resulting in formation of a GaN layer 17 having a thickness of about 1000 Å.

Then, the second layer 18 made of SiO$_2$, having a thickness about 2000 Å and a width a of about 5 μm, is formed in a striped pattern and each of the regions B where the layer 17 was exposed had a width b of about 5 μm, as in the first and second embodiments. Boundary lines between the regions A (which are defined above the islands of the second layer 18) and regions B (where the second layer 18) are removed from the layer 17 are in the [1–10] axis direction, which is perpendicular to the <110> direction of the silicon substrate 10.

The third layer 20 made of GaN, having a thickness of about 10 μm, was formed on the second layer 18 and on the regions B where the layer 17 is exposed. In this case, the GaN layer grows in a perpendicular direction on regions B where the layer 17 is exposed, using GaN of the exposed region B as nucleus. In each of the regions A (which are defined above the islands of the second layer 18), the GaN layer grows in a lateral direction, from the GaN layer grown epitaxially on an exposed portion of the layer 17, which serves as a nucleus. As a result, a GaN layer having improved crystallinity compared with those of the first and second embodiments can be obtained.

In the present (third) embodiment, the GaN substrate comprising the third layer 20 and having no dislocations can be obtained by polishing and etching to remove the silicon substrate 10 or the region C, which consists of layers from the silicon substrate 10 to the second layer 18, as in the second embodiment. In the present embodiment, the layer 17 and the third layer 20 are made of GaN. Alternatively, the layer 17 and the third layer 20 may be made of a group III nitride compound semiconductor represented by the formula Al$_x$Ga$_y$In$_{1-x-y}$N (0≦x≦1, 0≦y≦1, 0≦x+y≦1), having an identical composition. When SiO$_2$ is used for the second layer 18, a group III nitride compound semiconductor which does not contain Al is preferably used as the layer 17 and the third layer 20. As a matter of course, the compositions of a group III nitride compound semiconductor of the layer 17 may be rendered different from that of the third layer 20.

FIGS. 5A and 5B are schematic views showing a growing process according to embodiments of the present invention. In FIG. 5A, a GaN layer grows epitaxially in longitudinal and lateral directions according to the method of the present embodiment. The third layer 18 made of SiO$_2$ is formed in a striped pattern, which is longer in the [1–10] axis direction perpendicular to the <110> direction on the surface (111) of the silicon substrate 10. The third layer 20 made of GaN grows epitaxially in the [11-2] axis direction (lateral direction) in order to cover the upper surface of the second layer 18 made of SiO$_2$ more rapidly than in the [111] axis direction (longitudinal direction) which is perpendicular to the (111) plane.

As a comparative example, the second layer 18 made of SiO$_2$ is formed in a striped pattern, which is longer in the [11-2] axis direction, is laminated under the same conditions as that of the third embodiment. FIG. 5B is a schematic view showing the process of the comparative example. Although the third layer 20 made of GaN grows epitaxially in the [111] axis direction (longitudinal direction) which is perpendicular to the (111) plane, it hardly grows in the [11-2] axis direction (lateral direction) in order to cover the upper surface of the second layer 18 made of SiO$_2$.

EXAMPLE 4

Fourth Embodiment

This embodiment has multiple layers. A first layer and a second layer each have two-layer structure. The first layer consists of layers 21 and 22, and the second layer consists of a layers 31 and 32. The first layer and the second layer each formed on the layer 17 is represented by the "first" first layer 21 and the "first" second layer 31, respectively. The first layer and the second layer each formed on the "first" second and first layers 31 and 21 is represented by the "second" first layer 22 and the "second" second layer 32, respectively.

Figure 4:
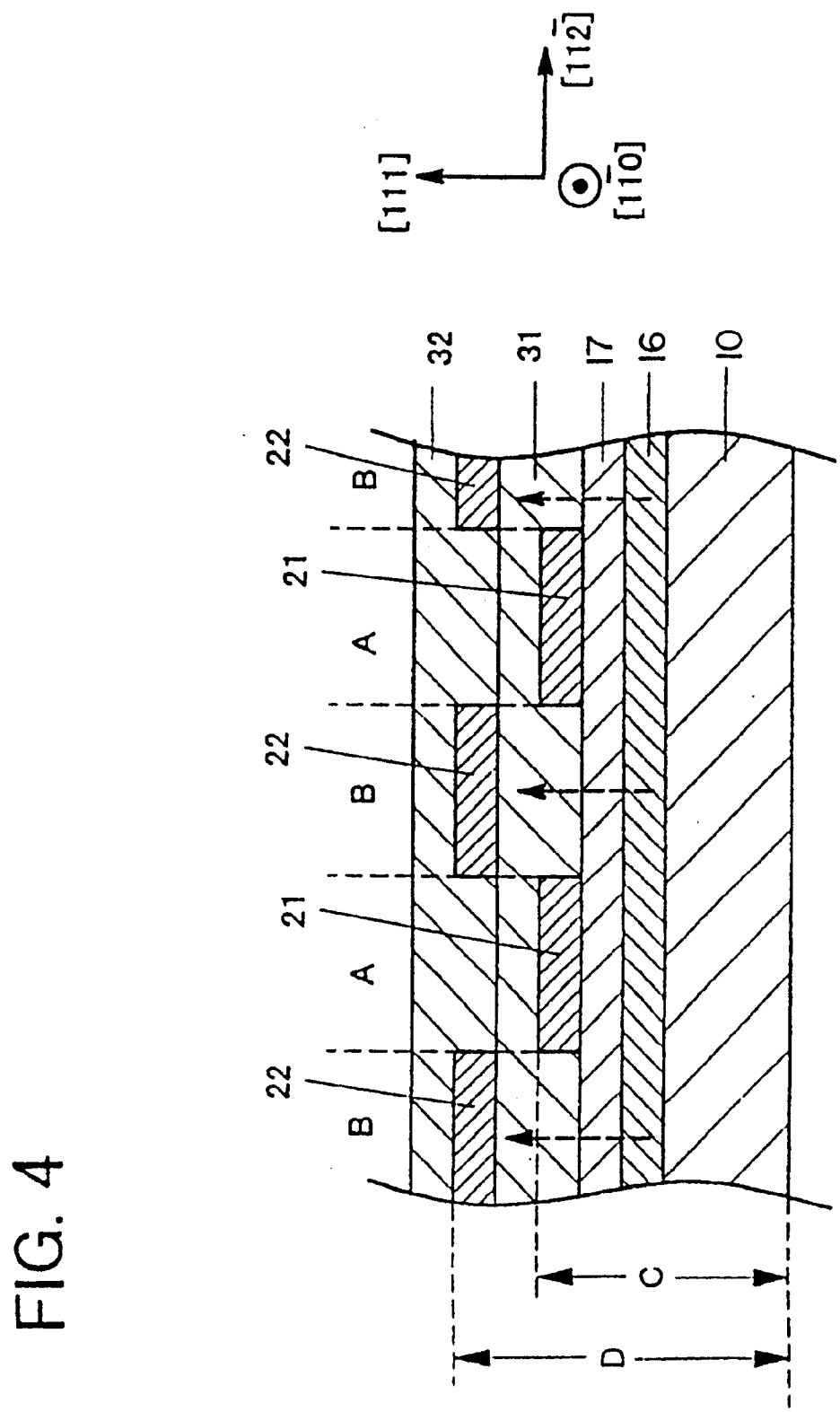
FIG. 4 is a schematic view of showing a structure of a group III nitride compound semiconductor in accordance with a fourth embodiment of the present invention.

In the present embodiment, after the layer consisting of the layers 16 and 17, a second layer 21 of SiO$_2$ and a third layer 31 consisting of a GaN layer are laminated on the substrate, as with layers 18 and 20 in the third embodiment, another layer (a fourth layer) 22 of SiO$_2$ is formed. The fourth layer 22 covers the regions of the third layer 31 which are not covered by the second layer 21 of SiO$_2$. Then a GaN layer grows epitaxially in order to cover the entire surface of the layer 31 and the fourth layer 22. Accordingly, a fifth layer 32 of GaN is formed. As shown in FIG. 4, the second layer 21 of SiO$_2$ covers the regions A and does not cover the regions B, while the fourth layer 22 of SiO$_2$ covers the regions B and does not cover the regions A. As a result, the third layer 31 made of GaN grows epitaxially in the regions B (where the layer 17 is exposed), covers the second layer 21 of SiO$_2$ (also covers the regions A by lateral growth). And the fifth layer 32 grows epitaxially in the regions A where the layer 31 is exposed, and covers the fourth layer 22 of SiO$_2$ (and also covers the regions B by lateral growth). Even when a growth defect (e.g., a crack) from the (111) plane of the silicon substrate 10 remains, a possibility that the growth defect (crack) is transmitted to the layer 32 is quite small as shown by arrows of broken lines in FIG. 4. That is, a growth defect (crack) that may be transmitted rectilinear in the [111] axis direction is perfectly screened by the fourth layer 22. In the present invention, by polishing and etching to remove the region D in FIG. 4, a group III nitride compound semiconductor substrate having no dislocations can be obtained by the fifth layer 32.

In the above embodiments, the layers 14, 20, 31 and 32 are made of GaN. Alternatively, they can be made of an aluminum gallium indium nitride represented by a general formula $Al_xGa_yIn_{1-x-y}N$ ($0 \leq x \leq 1$, $0 \leq y \leq 1$, $0 \leq x+y \leq 1$) and having an arbitrary composition ratio. However, because a group III nitride compound semiconductor including Al grows easily on an $SiO_2$ layer, a group III nitride compound semiconductor which does not include Al is preferably used.

In the embodiments, the layers 12, 18, 21 and 22 are formed in a striped pattern and are made of $SiO_2$. Alternatively, the layers 12, 18, 21 and 22 can be made of metals of high husing point such as tungsten (W) and amorphous silicon (Si). In case that the layers 12, 18, 21 and 22 comprise metals or amorphous silicon, electric current flows in the layers 12, 18, 21 and 22. As a result, electric current can flow more uniformly in thickness direction of the group III nitride compound semiconductor. When the layers 12, 18, 21 and 22 are made of metals of high husing point such as tungsten (W) and amorphous silicon(Si), a group III nitride compound semiconductor represented by a general formula $Al_xGa_yIn_{1-x-y}N$ ($0 \leq x \leq 1$, $0 \leq y \leq 1$, $0 \leq x+y \leq 1$) and having an arbitrary composition ratio does not grow epitaxially on the layers 12, 18, 21 and 22. Thus a group III nitride compound semiconductor represented by a general formula $Al_xGa_yIn_{1-x-y}N$ can be used to form those layers.

In the first to fourth embodiments, each layer can be formed after a buffer layer is formed on a substrate by growing a group III nitride compound semiconductor at low temperature.

Although in each of the embodiments described above the MOVPE method is performed under atmospheric pressure, the MOVPE method may be performed under a reduced pressure. Further, the MOVPE method may be performed under atmospheric pressure and a reduced pressure in combination.

The silicon substrate can be n-type, p-type or semi-insulating. For example, when the silicon substrate is formed to have n-type conduction, conduction type of the group III nitride compound semiconductor which grows on the substrate can be controlled by doping an n-type impurity such as silicon (Si) or germanium (Ge). And when the silicon substrate is not removed, the substrate preferably has an n-type or a p-type conduction.

The group III nitride compound semiconductor of the present invention can be used as a substrate of light-emitting devices such as LEDs and LDs. Also, the group III nitride compound semiconductor of the present invention can be used to light-receiving devices and electric devices. The group III nitride compound semiconductor can be used with the silicon substrate.

The foregoing detailed description of the preferred embodiments of the invention has been provided for the purpose of explaining the principles of the invention and its practical application, thereby enabling others skilled in the art to understand the invention for various embodiments and with various modifications as are suited to the particular use contemplated. The foregoing detailed description is not intended to be exhaustive or to limit the invention to the precise embodiments disclosed. Modifications and equivalents will be apparent to practitioners skilled in this art and are encompassed within the spirit and scope of the appended claims.

What is claimed is:

1. A group III nitride compound semiconductor, comprising:

a silicon (Si) substrate;

a first layer which is formed on and in contact with the (111) plane of said silicon substrate and made of a group III nitride compound semiconductor;

a second layer which is formed on said first layer such that first layer-exposed portions are formed in a scattered manner and on which a group III nitride compound semiconductor does not grow epitaxially;

a third layer which grows epitaxially on said first layer-exposed portions, or the regions which are not covered by said second layer, and which grows epitaxially on the regions which are covered by said second layer in a lateral direction, wherein said first layer is formed to have two-layer structure, consisting of a layer made of $Al_xGa_{1-x}N$ ($0<x \leq 1$) and a layer made of a group III nitride compound semiconductor formed on said layer made of $Al_xGa_{1-x}N$ ($0<x \leq 1$).

2. A group III nitride compound semiconductor according to claim 1, wherein said second layer is formed in a striped pattern.

3. A group III nitride compound semiconductor according to claim 1, wherein said exposed portions which are not covered by said second layer are longer in an axis direction which is perpendicular to <110> direction of said silicon substrate.

4. A group III nitride compound semiconductor according to claim 1, wherein said second layer comprises silicon oxide ($SiO_2$).

5. A group III nitride compound semiconductor according to claim 1, wherein said second layer comprises metals of high melting point or an amorphous silicon (Si).

* * * * *